United States Patent [19]
Tarumoto

[11] Patent Number: 5,455,145
[45] Date of Patent: Oct. 3, 1995

[54] METHOD OF MANUFACTURING DOUBLE LAYER RESIST PATTERN AND DOUBLE LAYER RESIST STRUCTURE

[75] Inventor: Hideki Tarumoto, Hyogo, Japan

[73] Assignee: Mitsubishi Denki Kabushiki Kaisha, Tokyo, Japan

[21] Appl. No.: 218,445

[22] Filed: Mar. 25, 1994

Related U.S. Application Data

[63] Continuation-in-part of Ser. No. 1,910, Jan. 8, 1993, abandoned, which is a continuation-in-part of Ser. No. 678,184, Mar. 29, 1991, abandoned, which is a continuation-in-part of Ser. No. 451,069, Dec. 15, 1989, abandoned.

[30] Foreign Application Priority Data

Dec. 24, 1988 [JP] Japan .................................. 63-327063

[51] Int. Cl.$^6$ ..................................................... G03C 1/74
[52] U.S. Cl. ........................... 430/325; 430/273; 430/326
[58] Field of Search ..................................... 430/325, 326, 430/312, 273

[56] References Cited

U.S. PATENT DOCUMENTS

| | | | |
|---|---|---|---|
| 4,524,121 | 6/1985 | Gleim et al. | 430/326 |
| 4,650,745 | 3/1987 | Eilbeck | 430/326 |
| 4,770,739 | 9/1988 | Orvek et al. | 430/313 |
| 4,835,086 | 5/1989 | Jain | 430/326 |
| 4,863,827 | 9/1989 | Jain et al. | 430/326 |
| 4,906,552 | 3/1990 | Ngo et al. | 430/312 |

FOREIGN PATENT DOCUMENTS

| | | | |
|---|---|---|---|
| 0190799 | 2/1985 | European Pat. Off. | 430/273 |
| 61-131446 | 6/1986 | Japan . | |
| 62-35346 | 2/1987 | Japan . | |
| 62-183449 | 8/1987 | Japan . | |
| 62-284356 | 12/1987 | Japan . | |

OTHER PUBLICATIONS

B. Lin, "Portable conformable mask—a hybrid near–ultraviolet and deep–ultraviolet patterning technique", SPIE, vol. 174 (Developments in Semi–conductor Microlithography IV, 1979), pp. 114–121.

Y. Yamashita et al, "New PCM (HR–PCM) Technique Using Novolak–diazide Type Photorisist as a Bottom Layer", SPIE, vol. 771 (Advances in Resist Technology and Processing IV, 1987), pp. 273–280.

MacDermid Microelectronic Chemicals specification, Ultra-Mac PR 1024 MB positive photoresist.

K. Tsuji et al, "Submicrometer Optical Lithography Using a Double–Layer Resist by a Single Development Technology", *IEEE Transactions on Electron Devices, vol. ED–31, No. 12 (Dec. 1984), pp. 1861–1866.*

(List continued on next page.)

*Primary Examiner*—Christopher D. Rodee
*Attorney, Agent, or Firm*—Lowe, Price, LeBlanc & Becker

[57] ABSTRACT

A method for forming a resist pattern using a double-layer resist. A substrate is prepared and then, a novolak i-line photoresist layer not photosensitive to a g-line but photosensitive to an i-line is formed on this substrate as a lower layer resist, by solving the novolak i-line photoresist in a first solvent. A novolak g-line photoresist layer photosensitive to the g-line in which a compound absorbing i-line is mixed is formed on this novolak i-line photoresist layer as an upper layer resist, by solving the novolak g-line photoresist in a second solvent to which is added a poor solvent in which the novolak i-line photoresist is substantially insoluble. Then, the upper layer resist is irradiated with the g-line using a mask and a pattern of this upper layer resist is formed by development. Thereafter, the whole surface of the substrate is irradiated with the i-line using this upper layer resist pattern as a mask to pattern the lower layer resist. Since the thus formed double-layer resist pattern uses the novolak photoresist as a lower layer resist, its dry etching resistance is large. In addition, since the novolak photoresist is used as a lower layer resist, exposure time of the lower layer resist can be shortened and the throughput is improved.

12 Claims, 7 Drawing Sheets

OTHER PUBLICATIONS

A. W. McCullough et al, "Polydimethylglutarimide (PMG) resist—A progress report", SPIE, vol. 631, Advances in Resist Technology and Processing III (1986), pp. 316–320.

M. Watts, "A High sensitivity two layer resist process fro use in high resolution optical lithography", SPIE, vol. 469, Advances in Resist Technolgy (1984), pp. 2–10.

"*The Substitution of Ethyl Cellosolve Acetate (ECA) as a Solvent Used in Dissolving Positive Photoresist*", Development Tendency, Semiconductor World 1991.1.

"*Modeling Thermal Effects for Simulation of Post Exposure Baking (PEB) Process in Positive Photoresist*", Japanese Journal of Applied Physics, vol. 30, No. 3, Mar. 1991, pp. 612–614.

"*A Positive Photoresist Optimized for Both I–Line and UV–3 Exposure*", SPIE vol. 631, Advances in Resist Technology & Processing III (1986).

METHOD OF MANUFACTURING DOUBLE LAYER RESIST PATTERN AND DOUBLE LAYER RESIST STRUCTURE

This application is a continuation-in-part of application Ser. No. 08/001,910 filed Jan. 8, 1993 abandoned which is a continuation-in-part of application Ser. No. 07/678,184 filed Mar. 29, 1991 abandoned which is a continuation-in-part of application Ser. No. 07/451,069 filed Dec. 15, 1989 abandoned.

BACKGROUND OF THE INVENTION

1. Field of the Invention

The present invention relates generally to a method of manufacturing a double layer resist pattern in the course of manufacturing semiconductor devices and the like and, more specifically, to a manufacturing method improved to provide highly precise double layer resist pattern having higher resistance against dry etching. The present invention further relates to a double layer resist structure providing such double layer resist patterns.

2. Description of the Background Art

As the degree of integration of a semiconductor device has increased recently, a technique capable of forming a fine resist pattern having a high aspect ratio in a manufacturing process has been increasingly demanded. Thus, the technique of forming a pattern using double layer resist has been proposed as a technique satisfying the demand. As this kind of method, for example, in SPIE Vol. 174, 114(1979), a first conventional method for forming a pattern using double-layer resist, comprising polymethylmethacrylate (hereinafter referred to as a PMMA) on a lower layer and a positive photoresist on an upper layer is proposed. FIGS. 6A to 6E are sectional views of a pattern during its manufacturing processes. Referring to these figures, a description is made of a conventional method for forming a fine pattern.

Referring to FIG. 6A, a PMMA photoresist is applied onto a substrate 1 to form a PMMA photoresist layer 2 serving as a resist of the lower layer. Then, a g-line photoresist photosensitive to a g-line having a wavelength of 436 nm is applied onto this PMMA photoresist layer 2 to form a g-line photoresist layer 3 serving as a resist on the upper layer. Thus, the double-layer resist is formed on the substrate 1.

Referring to FIG. 6B, exposure to a g-line 5 is performed using a mask 4 having a predetermined pattern. Since the PMMA photoresist layer 2 is not exposed to the g-line 5, a predetermined portion 3a (hereinafter referred to as a g-line exposure portion 3a) in the g-line photoresist layer 3 is only photosensitized.

Referring to FIG. 6C, when development is performed by alkali solution, only the g-line exposure portion 3a is only removed and a portion 3b unexposed to the g-line (hereinafter referred to as a g-line un-exposure portion 3b) remains on the PMMA photoresist layer 2.

Referring to FIG. 6D, the whole surface of the substrate 1 is exposed to a deep UV ray 8. In this case, since the g-line un-exposure portion 3b intercepts the deep UV ray 8, this g-line un-exposure portion 3b serves as a mask. As a result, a portion 2a of the PMMA photoresist layer 2 (hereinafter referred to as a deep UV-ray exposure portion 2a) exposed to the deep UV ray 8 is only photosensitized.

Referring to FIG. 6E, when development is performed by organic solvent, the deep UV ray exposure portion 2a is only selectively removed and a portion 2b unexposed to the deep UV ray 8 (hereinafter referred to as a deep UV ray un-exposure portion 2b) remains on the surface, so that a double-layer resist pattern 6 comprising the deep UV ray un-exposure portion 2b and the g-line un-exposure portion 3b is formed on the substrate 1.

Then, etching is performed on an aluminum wiring film and the like serving as a material to be etched and formed on the substrate, using this double-layer resist pattern 6 as a mask.

A first conventional method for forming a pattern is thus structured and it is characterized by the use of the PMMA photoresist layer 2 as a photoresist of the lower layer as shown in FIG. 6D. However, there was a disadvantage that it takes long to photosensitize the PMMA photoresist layer 2 and throughput (the number of wafers to be processed per line time) is low because the PMMA photoresist has low sensitivity. In addition, as shown in FIG. 6E, there was another disadvantage that it is impossible to form a highly precise and fine pattern in a material to be etched when the pattern 6 of the double-layer resist is used as a mask in a subsequent etching process because the PMMA photoresist layer 2 is inferior in dry etching resistance.

The double layer resist method employing PMMA as a photoresist of the lower layer, an alkali developer is used for developing the upper layer resist, while Methyl Isobuthyl Ketone which is an organic solvent, is used for developing the lower layer resist. Referring to FIG. 7 (corresponding to FIG. 6D), when the upper layer resist happens to be left due to insufficient developing or the like, there is a mixing layer 55 generated at the interface between the upper and lower layer resist. Since the mixing layer 55 is insoluble in organic solvent, it prevents the succeeding step of developing the lower layer resist by methyl isobutyl ketone, causing another disadvantage that the lower layer photoresist is not developed satisfactorily.

In a second prior art disclosed in Japanese Patent Laying-Open No. 62-183449, a novolak photoresist having high sensitivity and high resistance against dry etching is employed as the resist of the lower layer. The technique employing the novolak photoresist as the lower layer is also disclosed in SPIE vol. 771, 273 (1987).

FIGS. 8A to 8B show process steps for forming the double layer resist pattern disclosed in Japanese Patent Laying-Open No. 62-183449. The process steps of the second prior art will be described in the following with reference to these figures.

Referring to FIG. 8A, an Al layer 51 which is to be the interconnection metal is formed on a substrate 50.

Referring to FIG. 8B, MP-2400 (novolak photoresist produced by Shipley Company) is applied as the lower layer resist 52.

Thereafter, as shown in FIG. 8C, a photoresist formed of silyl ether of naphthoquinone diazide sulfonate of the novolak resin is formed as the upper layer resist 53. Thereafter, exposure is carried out by an optical stepper employing g-line of a mercury lamp. Referring to FIG. 8D, development is carried out by using a mixture of monochlorobenzene and cyclohexane (2:1 weight proportion) to form the pattern of the upper layer resist 53.

Thereafter, the substrate 50 is entirely irradiated by the light having the wavelength of 200 to 300 nm by using a 500 W Xe-Hg lamp.

Referring to FIG. 8E, development is carried out by using a solution of MP-2401 developer (developer for MP-2400) attenuated to 5 times by water for 30 sec. The double layer resist pattern 54 is formed through these steps.

Thereafter, the Al layer 51 is dry etched by a conventional method using the double layer resist pattern 54 as a mask, the double layer resist pattern 54 is removed, and the Al interconnection pattern shown in FIG. 8F is provided.

The above described second prior art has the following disadvantages.

Referring to FIG. 8D, the light possibly be transmitted through the upper layer resist 53 as the upper layer resist 53 does not fully function as the mask when the substrate 50 is irradiated by light. Consequently, referring to FIG. 9A, the thickness of the double layer resist 54 is reduced. When the Al layer 54 is dry etched by using the thin double layer resist 54, the dry etching process of the Al layer 51 does not proceed as expected due to the insufficient thickness of the double layer resist 54, and the desired pattern of the Al interconnection can not be provided, as shown in FIG. 9B.

SUMMARY OF THE INVENTION

An object of the present invention is to provide a method of forming a double layer resist pattern improved to perform highly precise and miniaturized patterns of the object to be etched during the step of etching for manufacturing semiconductor devices and the like.

Another object of the present invention is to provide a method of forming a double layer resist pattern improved to form highly precise and miniaturized patterns of an object to be etched by using a lower layer resist having high resistance against dry etching.

A further object of the present invention is to provide a method of manufacturing a double layer resist pattern improved to increase through put and to reduce time required for exposure.

A still further object of the present invention is to provide a method of manufacturing a double layer resist pattern improved to surely carry out development of the lower layer resist even if the upper layer resist happens to be left by insufficient development or the like.

A still further object of the present invention is provide a double layer resist structure improved to provide highly precise double layer resist pattern.

According to a first aspect of the present invention, a method of manufacturing a double layer resist structure including an upper layer resist and a lower layer resist on a substrate for lithography comprises the steps of: preparing first material to be used for said lower layer resist at photosensitive to first wavelength light; preparing second material to be used for said upper layer resist and photosensitive to second wavelength light; preparing a light absorbing agent with absorbs said first wavelength light; and having said second material include said light absorbing agent. Next, the first material is applied onto the substrate for forming the lower layer resist. Then, the second material including the light absorbing agent is applied onto the lower layer resist for forming the upper layer resist. Then, a predetermined pattern of the upper layer resist is formed by irradiating selectively the upper layer resist with the second wavelength light, and the same is developed. Then, a predetermined pattern of the lower layer resist is formed on the substrate by irradiating the lower layer resist with the first wavelength light while using the upper layer resist pattern as a mask and then the same is developed.

In the first aspect of the present invention, a material which can be developed by an alkali developer is selected as the above mentioned first material, a material which can be developed by an alkali developer is selected as the above mentioned second material, and preferably the upper layer resist and the lower layer resist are both developed by an alkali developer.

According to a second aspect of the present invention, a double layer resist structure for lithography comprises a lower layer resist formed on a substrate and photosensitive to a first wavelength light, and an upper layer resist formed on the lower layer resist and photosensitive to a second wavelength light, wherein the upper layer resist includes a light absorbing agent which absorbs the first wavelength light.

According to the present invention, since a high sensitive novolak photoresist is used as a lower layer resist, the exposure time of the lower layer resist can be reduced and the throughput is improved. In addition, since the novolak photoresist has large etching resistance, it is possible to form on the substrate a fine pattern of the material to be etched which is very precise in following a resist pattern when it is used as a mask during the etching process of the material.

Furthermore, since the upper layer resist comprises the compound absorbing the light of the first wavelength, when the lower layer resist is exposed to the light of the first wavelength using the upper layer resist pattern as a mask, then unexposed portion of the upper layer resist serves strongly as a mask and patterning of the lower layer resist can be precisely performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description is made on an embodiment of the present invention in reference to the figures.

FIGS. 1A to 1E are sectional views of a semiconductor device showing a method for forming a resist pattern in accordance with the present invention. As discussed in detail below with individual reference to FIGS. 1A to 1E, the method of the present invention involves the steps of:

providing a first resist composition by solving a first material sensitive to a first wavelength of light in a first solvent, for forming the lower layer resist;

providing a second resist composition by solving a second material sensitive to a second wavelength of light in a second solvent, for forming the upper layer resist;

adding to the second resist composition a poor solvent in which the first material in the lower layer resist is substantially insoluble;

adding a light absorbing agent which absorbs the first wavelength light to the second resist composition;

applying the first resist composition onto the substrate;

prebaking the first resist composition applied on the substrate to remove the first solvent included in the first resist composition, thereby forming the lower layer resist on the substrate;

applying the second resist composition mixed with the light absorbing agent and the poor solvent onto the lower layer resist;

prebaking the second resist composition to remove the second solvent and the poor solvent included in the second resist composition, thereby forming the upper layer resist on the lower layer resist;

forming a predetermined pattern of the upper layer resist by selectively irradiating the upper layer resist with the second wavelength light and developing the same; and forming a predetermined pattern of the lower layer resist by irradiating the lower layer resist with the first wavelength light while using the upper layer resist pattern as a mask and then developing the same.

Figure 1A:
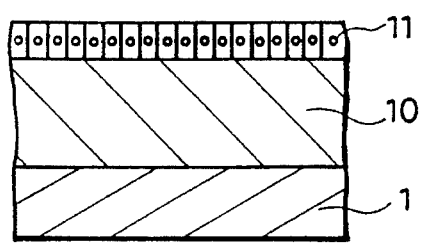
FIGS. 1A to 1E are sectional views of a semiconductor device showing processing steps in accordance with one embodiment of the present invention.

Referring to FIG. 1A, a novolak i-line photoresist photosensitive to an i-line having a wavelength of 365 nm is applied onto a substrate 1 to form a novolak i-line photoresist layer 10. The novolak i-line photoresist employed is developed an alkali developer and is hardly sensitive to g-line light having the wavelength of 436 nm. AZ 5200 (photoresist produced by Hoechst AG) or MP1024MB (photoresist produced by Shipley Company) is used as the photoresist having such characteristics. Then, the novolak g-line photoresist photosensitive to g-line including phenazine and a solvent such as benzene, toluene or xylene in which the material in the lower layer resist is substantially insoluble is applied on the novolak i-line photoresist layer 10. The solvent is added to be not lower than 50% by volume to the resist. For example, MCPR-2000H (photoresist produced by Mitsubishi Chemical Industries Co., Ltd.) with the aforementioned solvent added thereto is used as the novolak g-line photoresist. Thereafter, prebaking is done at a temperature of 70° C. to 120° C. to form a novolak g-line photoresist layer 11. A double-layered resist is formed on the substrate 1 in this manner. The solvent is added for the following reason. Namely, by adding the solvent to the upper layer resist, the solution velocity of the resin in the lower layer resist to the upper layer resist can be sufficiently reduced. Consequently, when the upper layer resist is applied on the lower layer resist, the lower layer resist is not dissolved in the upper layer resist. Therefore, precision in succeeding patterning can be improved.

Figure 1B:
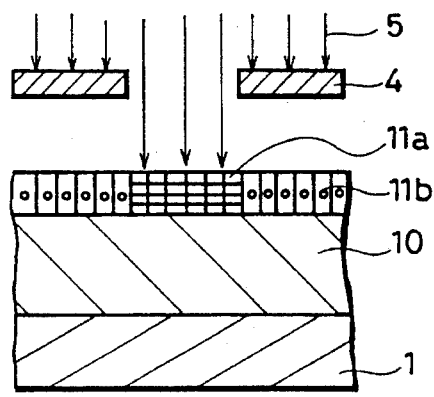

Referring to FIG. 1B, a g-line 5 is irradiated, using a predetermined mask 4. Then, since the novolak i-line photoresist layer 10 is hardly photosensitive to the g-line, a predetermined portion 11a (hereinafter referred to as a g-line exposure portion 10a) in the novolak g-line photoresist is only photosensitized.

Figure 1C:
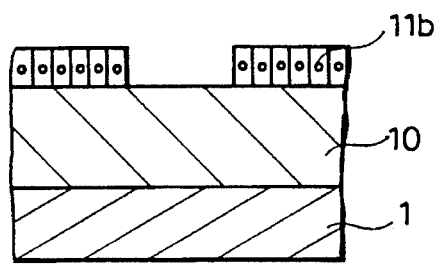

Referring to FIG. 1C, the g-line exposure portion 11a is only removed by developing it with alkali developing solution and a portion 11b not photosensitized by the g-line (hereinafter un-exposure portion 11b) remains on the novolak i-line photoresist layer 10.

Figure 1D:
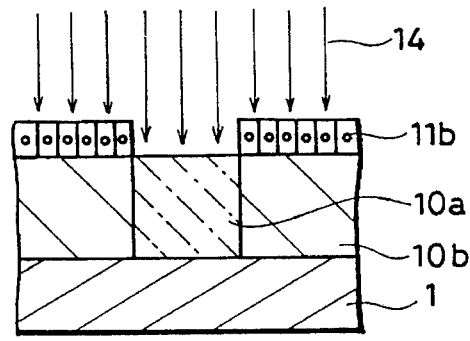

Referring to FIG. 1D, the whole surface of the substrate 1 is exposed to an i-line 14. The g-line un-exposure portion 11b comprises phenazine. Since phenazine has very large molar extinction coefficient of $10^{4.5}$ with a λmax of 362.5 nm, the i-line 14 is absorbed by this phenazine and intercepted. Therefore, the g-line un-exposure portion 11b serves strongly as a mask and only the portion 10a exposed to the i-line 14 in the novolak i-line photoresist layer 10 (hereinafter referred to as an i-line exposure portion 10a) is photosensitized.

Figure 1E:
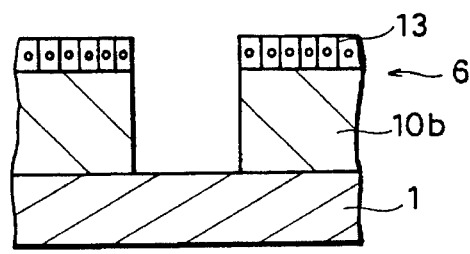

Then, referring to FIG. 1E, only the i-line exposure portion 10a is selectively removed by developing with alkali developing solution and a portion 10b unexposed to the i-line 14 (herein after referred to as an i-line un-exposure portion 10b) remains on the substrate 1 to form a double-layer resist pattern 6 on the substrate 1. In this case, since the i-line un-exposure portion 10b is not exposed to the i-line 14 at all the pattern configuration of the i-line un-exposure portion 10b is highly precise.

Then, etching is performed on a silicon oxide film layer, polysilicon layer, metal wiring film layer and the like of a material to be etched (not shown) and formed on the substrate 1, using this double-layer resist pattern 6 as a mask. At this time, since the novolak photoresist is used as a lower layer resist, its dry etching resistance is excellent and highly precise pattern of the material to be etched can be obtained.

The novolak i-line photoresist layer 10 and the novolak g-line photoresist layer 11 can be both developed by alkali developer. Therefore, even if the novolak i-line photoresist layer 10 is left due to insufficient development and form a mixing layer with the novolak g-line photoresist layer 11, it does not prevent the succeeding step of development using an alkali developer. Accordingly, highly precise pattern of the lower layer resist can be provided.

Next, a detailed description is made of the present invention in reference to a concrete example.

FIGS. 2A to 2G are sectional views of a semiconductor device showing processing steps in case where the present invention is applied in forming a pattern of an aluminum wiring on a substrate.

Figure 2A:
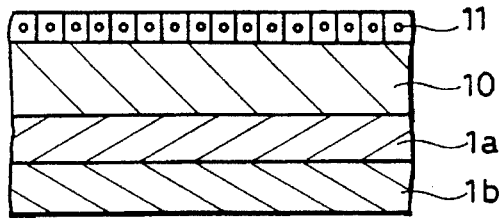
FIGS. 2A to 2G are sectional views of a semiconductor device showing processing steps when the present invention is applied to the formation of an aluminum wiring.

Referring to FIG. 2A, an oxide film 1b is formed on a semiconductor substrate (not shown). An aluminum layer 1a with a film thickness of 1 μm is formed on the oxide film 1b as a metal for wiring. Then, the MP-2400 of the novolak i-line photoresist photosensitive to the i-line is applied with a film thickness of 1.4 μm as a lower layer resist to form a novolak i-line photoresist layer 10. Then, on this novolak i-line photoresist layer 10, a novolak g-line photoresist with a film thickness of 0.5 μm in which MCPR 2000H is mixed with phenazine in the ratio of 1.0% by weight is applied by spinning to form a novolak g-line photoresist layer 11. Then, pre-baking is performed at 90° C. for 100 second to form a double-layer resist.

Figure 2D:
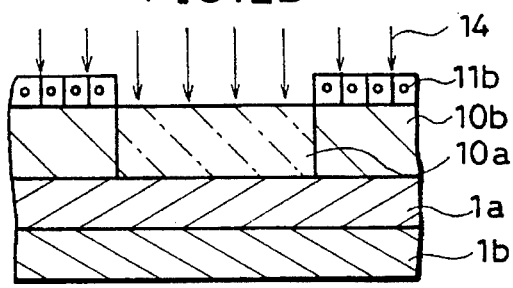
Figure 2B:
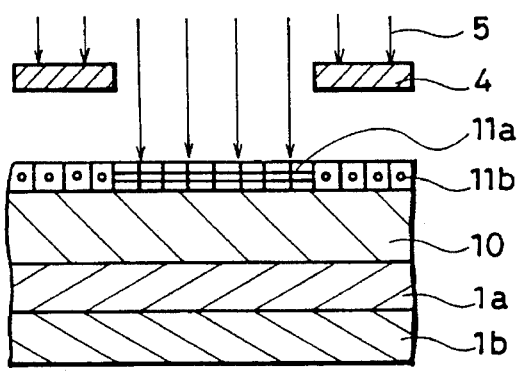

Referring to FIG. 2B, the upper layer resist is exposed to the g-line 5 with an exposure value of 130 mj/cm² using an appropriate mask 4 to form a g-line exposure portion 11a. The g-line are provided after the light from a mercury lamp is processed with a g-line stepper.

Figure 2E:
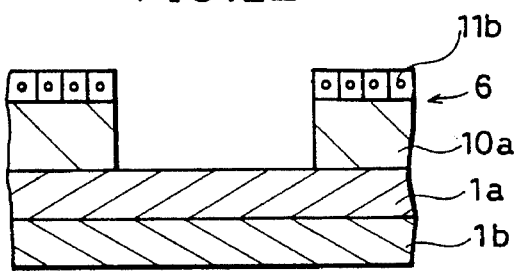
Figure 2C:
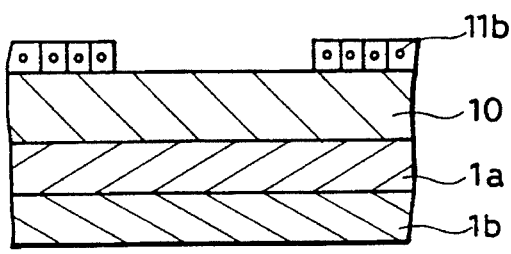

Referring to FIG. 2C, development is performed using

NMD-W developing solution (water solution of tetramethylammonium hydroxide of 2.38% by weight made by Tokyo Ohka Kogyo Co. Ltd.), only the g-line exposure portion 11a is selectively removed and a portion unexposed to the g-line (g-line un-exposure portion 11b) remains on the novolak i-line photoresist layer 10.

Referring to FIG. 2D, the whole surface of the substrate is irradiated with the i-line 14 with an exposure value of 300 mj/cm$^2$. The i-line is obtained by processing the light from a mercury lamp with aligner. In this case, since phenazine is mixed by 1.0% by weight in the g-line un-exposure portion 11b, this phenazine absorbs the i-line 14, so that the i-line 14 is completely intercepted at this portion. Therefore, the g-line un-exposure portion 11b serves strongly as a mask during exposure by the i-line 14. Thus, a portion 10a exposed to the i-line 14 in the novolak i-line photoresist 10 (hereinafter referred to as an i-line exposure portion 10a) is photosensitized.

Then, referring to FIG. 2E, after development for 60 seconds using NMD-W developing solution, a double-layer resist pattern 6 having line and space with a width of 0.5 μm is formed.

Figure 2F:
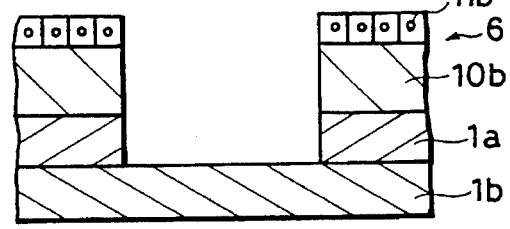

Referring to FIG. 2F, dry etching is performed on aluminum layer 1a of a material to be etched using this double-layer resist pattern 6 as a mask.

Figure 2G:
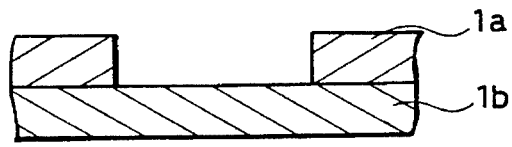

Thereafter, referring to FIG. 2G, after removing the double-layer resist pattern 6, an aluminum wiring pattern 1a with 0.5 μm line and space is obtained.

Then, an experiment is performed to obtain an appropriate amount of phenazine to be mixed with the upper layer resist in the processing steps of forming the aluminum wiring shown in FIGS. 2A to 2G.

Figure 3A:
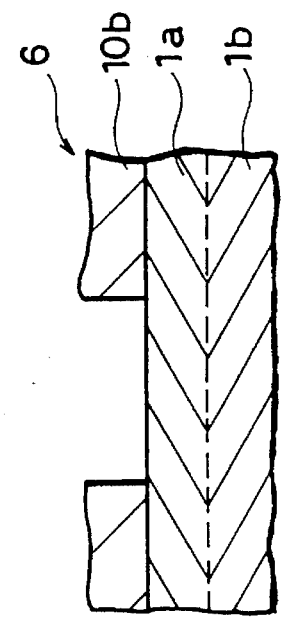
FIGS. 3A, 3B, 4A and 4B are sectional views of a semiconductor device showing the result of an experiment performed to obtain an appropriate amount of a compound absorbing light of a second wavelength.
Figure 3B:
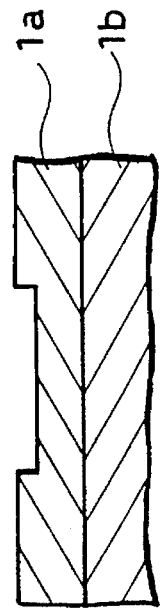

FIGS. 3A (which corresponds to FIG. 2D) and FIG. 3B (which corresponds to FIG. 2G) are sectional views of a semiconductor device showing processing steps, wherein a MCPR 2000 H (mixture of a photosensitive material, novolak resin and a solution) mixed with phenazine above 0.3% by weight is used as the upper layer resist. In this case, as apparent from FIG. 3A, the double-layer resist pattern 6 having a sufficient film thickness is obtained and as shown in FIG. 3B, a highly precise aluminum wiring pattern 15 is formed.

Figure 4A:
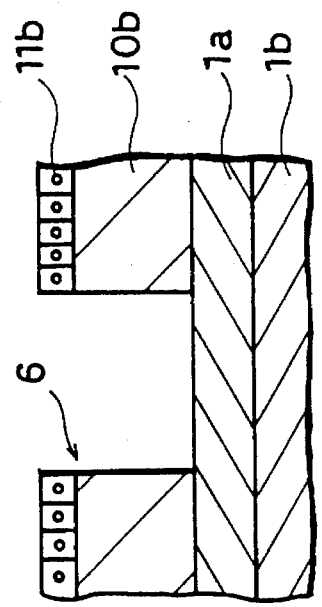
Figure 4B:
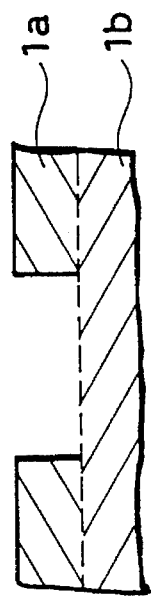

On the other hand, FIG. 4A (which corresponds to FIG. 2D) and FIG. 4B (which corresponds to FIG. 2G) are sectional views of a semiconductor device showing the processing steps, wherein the MCPR 2000 H mixed with phenazine by 0.1% by weight is used as the upper layer resist. In this case, as apparent from FIG. 4A, since the g-line un-exposure portion 11b has not sufficiently function as a mask and the novolak i-line photoresist just under the g-line un-exposure portion 11b is photosensitized, with the result that a resist pattern having a sufficient film thickness is not obtained. As a result, referring to FIG. 4B, since the film thickness of the resist pattern 6 is not sufficient, dry etching on an aluminum layer 1a does not proceed according to expectation and a desired pattern of an aluminum wiring cannot be obtained.

Although phenazine is used as a compound absorbing the i-line in the above described embodiment, the present invention is not limited to this and a compound having a very large absorbance around a wavelength of 365 nm such as 4-aminotropone having a λmax of 365 nm and a molar extinction coefficient of $10^{4.4}$, 9 and 10-dimethylanthracene having a λmax of 376 nm and a molar extinction coefficient of $10^{3.7}$ and the like is quite worth using.

Although the i-line was used as the light having the first wavelength in the above described embodiment, the present invention is not limited to this.

FIGS. 5A to 5E are sectional views of a semiconductor device showing the processing steps when an excimer laser (wavelength is 254 nm) is used as the light of the first wavelength.

Figure 5A:
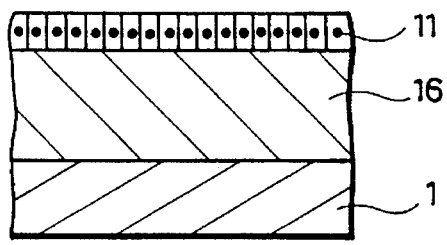
FIGS. 5A to 5E are sectional views of a semiconductor device showing processing steps in accordance with another embodiment of the present invention.

Referring to FIG. 5A, novolak photoresist which is almost or completely not photosensitive to the g-line but photosensitive to the excimer laser is applied onto a substrate 1 as a lower layer resist to form a novolak photoresist layer 16 photosensitive to the excimer laser. All kinds of resist can be used as this novolak photoresist, if they are generally used as a resist photosensitive to the excimer laser. Then, a novolak g-line photoresist comprising phenanthrene and photosensitive to the g-line is applied onto the photoresist 16 photosensitive to this excimer laser, as the upper layer resist to form a novolak g-line photoresist layer 11. In addition, the above described MCPR-2000H is preferably used as the novolak g-line photoresist. As described above, a double-layer resist is formed on the substrate 1.

Figure 5B:
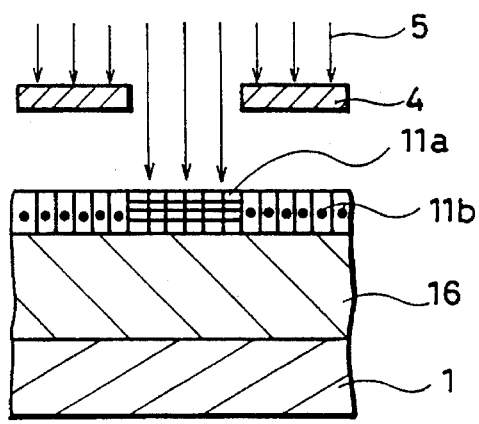

Referring to FIG. 5B, exposure to the g-line 5 is performed using a predetermined mask. Then, since the photoresist photosensitive to the excimer laser is not photosensitive to the g-line 5, a predetermined portion 11a of the novolak g-line photoresist layer 11 (hereinafter referred to as a g-line exposure portion 11a) is only photosensitized.

Figure 5C:
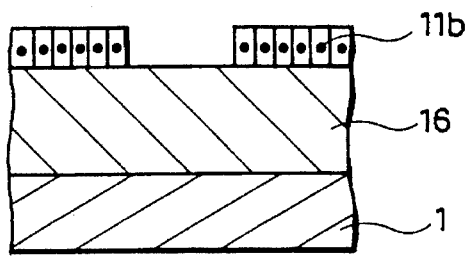

Referring to FIG. 5C, only the g-line exposure portion 11a is selectively removed after development and a portion 11b unexposed to the g-line (hereinafter referred to as a g-line un-exposure portion 11b) remained on the photoresist 16 photosensitive to the excimer laser.

Figure 5D:
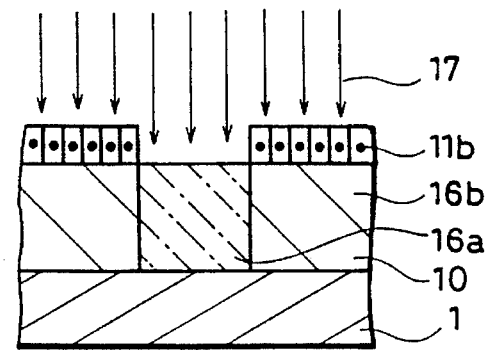

Referring to FIG. 5D, the whole for surface of the substrate 1 is irradiated by an excimer laser 17. In this case, since the g-line un-exposure portion 11b comprises phenanthrene and this phenanthrene has λmax of 251 nm and very large molar extinction coefficient of $10^{4.8}$, the excimer laser 17 radiated on this portion is absorbed in phenanthrene and completely intercepted at this portion. Therefore, the g-line un-exposure portion 11b serves strongly as a mask and a portion 16a exposed to the excimer laser 17 in the photoresist layer 16 photosensitive to the excimer laser (hereinafter referred to as an excimer laser exposure portion 16a) is only photosensitized.

Figure 5E:
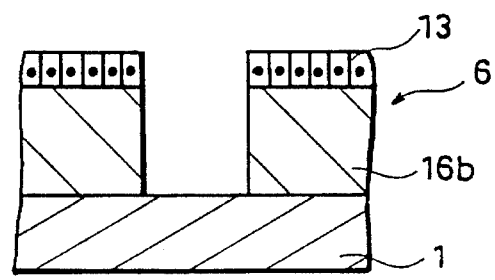
Figure 6A:
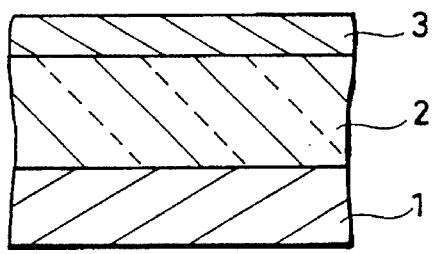
FIGS. 6A to 6E are sectional views of a semiconductor device showing a first conventional method for forming a resist pattern.
Figure 6B:
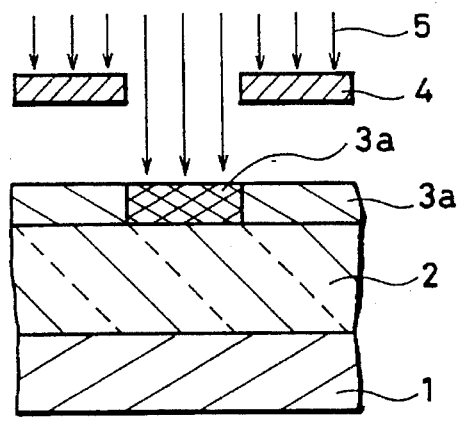
Figure 6C:
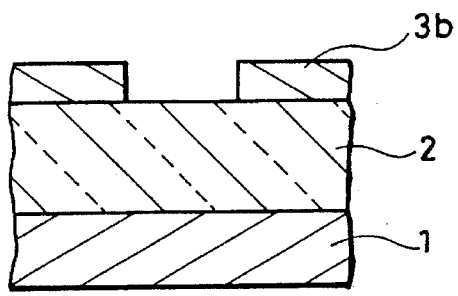
Figure 6D:
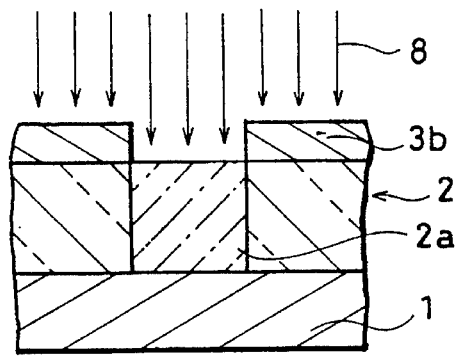
Figure 6E:
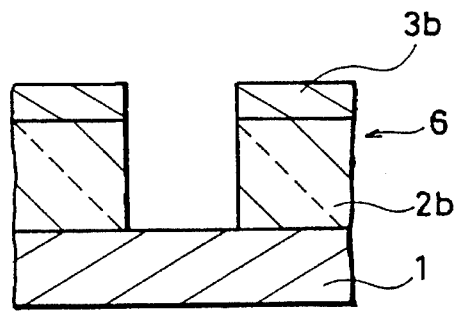
Figure 7:
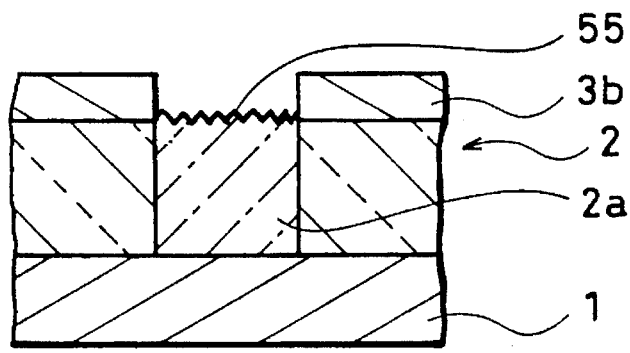
FIG. 7 shows a problem generated when an alkaline developer is used for developing the upper layer resist and an organic solvent is used for developing the lower layer resist.
Figure 9A:
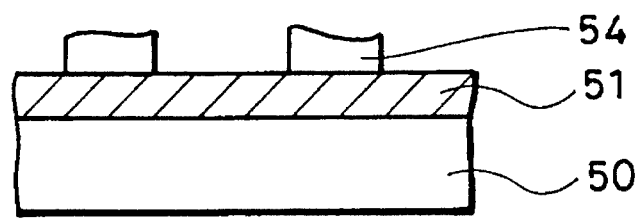
FIGS. 9A and 9B show disadvantages of the prior art method of FIGS. 8A to 8F.
Figure 9B:
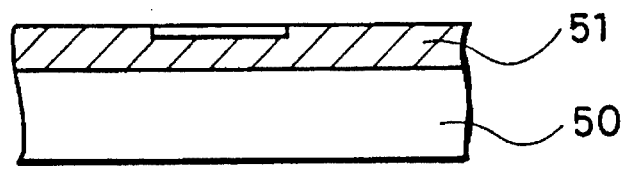
Figure 8A:
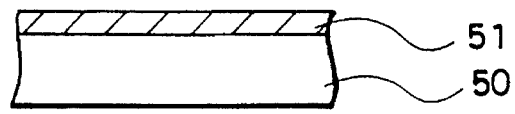
FIGS. 8A to 8F show, in cross section, the process steps of a prior art which employs a novolak photoresist as a lower layer resist.
Figure 8B:
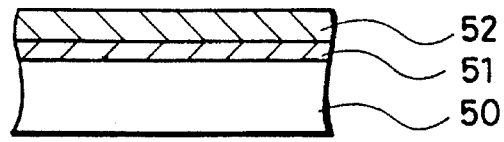
Figure 8C:
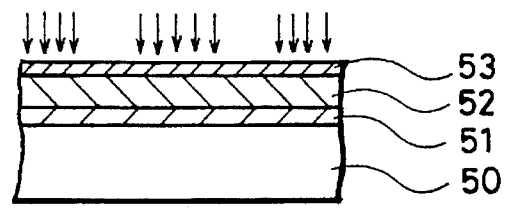
Figure 8D:
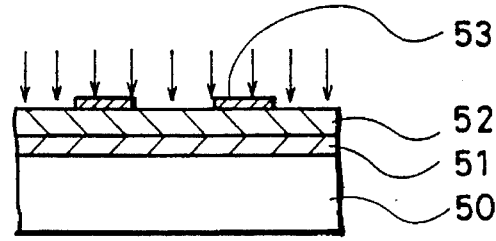
Figure 8E:
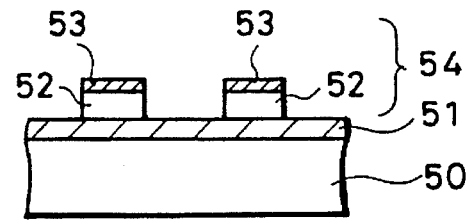
Figure 8F:
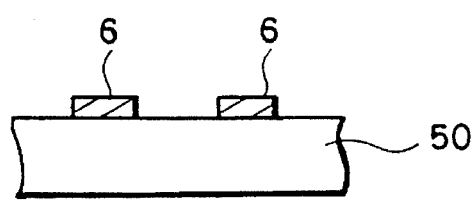

Then, referring to FIG. 5E, only the excimer laser exposure portion 16a is selectively removed after development and a portion 16b unexposed to the excimer laser 17 (hereinafter referred to as an excimer laser un-exposure portion 16b) remains to form a double-layer resist pattern 6 on the substrate 1. During this processing, the excimer laser un-exposure portion 16b was not exposed to the excimer laser 17 at all, so that the pattern configuration of the excimer laser un-exposure potion 16b is highly precise. Then, etching is performed on an oxide film, polysilicon film, aluminum wiring film and the like which are materials to be etched on the substrate using this double-layer resist pattern 6. In this case, since the novolak photoresist is used as the lower layer resist, its dry etching resistance is excellent and a highly precise pattern of the materials to be etched can be obtained.

Although phenanthrene is illustrated as a compound absorbing the excimer laser in the above described embodiment adopting the excimer laser, the present invention is not limited to this and a compound is worth using, which has very large absorbance to the excimer laser, such as Triphenylene having a λmax of 206 nm and a molar extinction constant of $10^{5.2}$, phenothiazine having a max of 254 nm and a molar extinction constant of $10^{4.5}$ and the like.

Although the g-line is used as light of the second wavelength and the i-line or excimer laser is used as light of the first wavelength in the above described embodiment, the present invention is not limited to this.

As described above, in the present invention, a light absorbing agent absorbing the first light employed for exposing the lower layer resist is included in the upper layer resist. By the function of this light absorbing agent, the upper layer resist pattern serves good as a mask in exposing the lower layer resist with the first light, with the upper layer resist pattern used as the mask. More specifically, the problem that the first light passes through the pattern of the upper layer resist to sensitize that portion of the lower layer resist which is positioned directly below the mask can be prevented. Consequently, the double layer resist pattern with high precision can be provided.

In accordance with a preferred embodiment, a material which can be developed by an alkali developer is selected as an upper layer resist and a material which can be developed by an alkali developer is selected as the lower layer resist and, the resist are both developed by alkali developer. In that case, even if the upper layer resist is left due to insufficient development with the remainder forming a mixing layer with the lower layer resist, the mixing layer is soluble in alkali developer. Therefore, the mixing layer does not prevent development of the lower layer resist. Consequently, highly precise double layer resist pattern can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a double-layer resist structure including an upper layer resist and a lower layer resist on a substrate for lithography, comprising the steps of:
   (a) providing a first resist composition by solving a first material sensitive to a first wavelength of light in a first solvent, for forming said lower layer resist;
   (b) providing a second resist composition by solving a second material sensitive to a second wavelength of light in a second solvent, for forming said upper layer resist;
   (c) adding to said second resist composition a poor solvent in which the first material in said lower layer resist is substantially insoluble, said poor solvent being added in an amount of not less than 50% by volume of said second resist composition;
   (d) adding a light absorbing agent which absorbs said first wavelength light to said second resist composition;
   (e) applying said first resist composition onto the substrate;
   (f) prebaking said first resist composition applied on said substrate to remove said first solvent included in the first resist composition, thereby forming said lower layer resist on said substrate;
   (g) applying said second resist composition mixed with said light absorbing agent and said poor solvent onto said lower layer resist;
   (h) prebaking said second resist composition to remove said second solvent and said poor solvent included in the second resist composition, thereby forming said upper layer resist on said lower layer resist;
   (i) forming a predetermined pattern of said upper layer resist by selectively irradiating said upper layer resist with said second wavelength light and developing the same; and
   (j) forming a predetermined pattern of said lower layer resist by irradiating said lower layer resist with said first wavelength light while using the upper layer resist pattern as a mask and then developing the same.

2. A method according to claim 1, wherein a material which is not sensitive or scarcely sensitive to said second wavelength light is selected as said first material.

3. A method according to claim 1, wherein
   said light absorbing agent is included to be no less than 0.3 wt. % of the total weight of the second material.

4. A method according to claim 1, wherein a novolak photoresist is used as said first material.

5. A method according to claim 4, wherein a novolak photoresist is used as said second material.

6. A method according to claim 1, wherein said first wavelength light is i-line light, and said light absorbing agent is a compound selected from the group consisting of phenazine, 4-aminotropone and 9,10-dimethylanthracene.

7. A method according to claim 6, wherein
   said light absorbing agent is phenazine.

8. A method according to claim 6, wherein said light absorbing agent is 4-aminotropone or 9,10-dimethylanthracene.

9. A method according to claim 1, wherein
   said first wavelength light is rays emitted from excimer laser light, and said light absorbing agent is a compound selected from the group consisting of phenanthrene, triphenylene and phenothiazine.

10. A method according to claim 1, wherein
    a novolak photoresist which can be developed by an alkali developer is selected as said first material,
    a novolak photo resist which can be developed by an alkali developer is selected as said second material,
    said upper layer resist is developed by an alkali developer, and
    said lower layer resist is also developed by an alkaline developer.

11. The method according to claim 1, wherein said poor solvent is selected from the group consisting of benzene, toluene and xylene.

12. The method according to claim 1, wherein
    said poor solvent is miscible with said second solvent included in said second composition.

* * * * *